United States Patent [19]

Higuchi et al.

[11] Patent Number: 4,928,265
[45] Date of Patent: May 22, 1990

[54] SEMICONDUCTOR INTEGRATED CIRCUIT

[75] Inventors: Hisayuki Higuchi, Kokubunji; Noriyuki Homma, Kodaira; Makoto Suzuki, Niiza; Suguru Tachibana, Hachioji, all of Japan

[73] Assignee: Hitachi, Ltd., Kyo, Japan

[21] Appl. No.: 266,148

[22] Filed: Nov. 2, 1988

[30] Foreign Application Priority Data

| Nov. 2, 1987 | [JP] | Japan | 62-275812 |
| Jan. 22, 1988 | [JP] | Japan | 63-10624 |
| Mar. 11, 1988 | [JP] | Japan | 63-56145 |
| Mar. 11, 1988 | [JP] | Japan | 63-56147 |

[51] Int. Cl.$^5$ .............................................. G11C 11/40
[52] U.S. Cl. ........................... 365/189.01; 365/189.05; 365/230.01; 365/233
[58] Field of Search ...................... 365/189.01, 189.04, 365/189.05, 230.01, 233

[56] References Cited

U.S. PATENT DOCUMENTS

4,773,049 9/1988 Takemae ...................... 365/189.01

Primary Examiner—Terrell W. Fears
Attorney, Agent, or Firm—Kenyon & Kenyon

[57] ABSTRACT

Considering the dispersion in the access time of semiconductor memories, at least a first and a second memory circuit are connected to the output of a sense amplifier. The output of the sense amplifier is an input to these two memory circuits alternatively at different timings. The data stored in these memory circuits are alternately transferred to a data output circuit. Even when the access time becomes long, the desired sense data can be successively read out from the output of the data output circuit at a short time interval determined by the clock cycle. When the access time becomes short and even when a second data is generated from the output of the sense amplifier at the timing of transferring a first data in the first memory circuit to the data output circuit, the first data held in the first memory circuit is prevented from being renewed by the second data. In this case too, the desired sense data can be successively read out from the output of the data output circuit at a time interval determined by the clock cycle.

9 Claims, 10 Drawing Sheets

SEMICONDUCTOR INTEGRATED CIRCUIT

BACKGROUND OF THE INVENTION

1. Field of the Invention

The present invention relates to a semiconductor integrated circuit, and more particularly to a semiconductor integrated circuit adapted to high speed operation.

2. Description of the Related Art

In these years, the operation speed and the integration density of the integrated circuit have been significantly improved, along with the miniaturization of the semiconductor elements. Particularly, BiCMOS LSI which employs the combination of CMOSFETs and bipolar transistors and enabling high speed operation and low power dissipation, is being developed.

With respect to the memory LSI, however, the fastest memory LSI is the bipolar memory LSI employing the emitter-coupled logic (ECL) circuits. This LSI dissipates a relatively large power and hence is limited in the integration density at most at 64 kbits. With respect to the memory LSI employing CMOSs, LSIs, each including 1 Mbits memory have already been made. The operation speed of these CMOS circuits, however, is slow, being ½ to 1/5 of that of the ECL circuits. Therefore, bipolar memories employing the ECL circuits are mainly used in the field of LSI which is required to operate at a high speed. In the memory LSI, the integration density and the operation speed are in a trade-off relationship with the restriction of power dissipation, and the LSI of high integration density can not fully realize high speed performance. LSIs of low power dissipation and of high speed operation have been strongly desired. Under these circumstances, BiCMOS memory LSIs have been attracting attention as memory LSIs of high integration density and high operation speed.

This trend is ascribed to the recent tendency of high speed and high function of electronics instruments.

Miniaturization of semiconductor elements has been advanced to respond this requirement. Fine pattern processings, however, need corresponding facilities and equipments. It is, hence, not easy to rapidly develop the fine pattern processings. Thus, attempts have been performed to enhance the high speed operation by the expedients in the circuit design. For example, high speed memory circuits utilizing pipeline systems are proposed and fabricated as described in JP-B-62-44352 specification and "Interface" August, 1987 issue, page 212 (introducing Brooktree Bt401-404 type bipolar memory, Fujitsu MBM 10423 LL type 1 kbits bipolar memory). In the pipeline system of the invention described in the above-mentioned JP-B-62-44352, a piepline system is proposed performs reading and writing of information at a shorter time interval than the information read time of the memory circuit (address access time: time from the input of an information read signal to the output of a recorded information from a memory cell, hereinafter referred to as access time), by dividing the operation of the memory circuit along the signal flow and operating the respective circuits independently. Further, in the invention described in the above-mentioned specification, in practice there is a need for disposing latch circuits between adjacent divided circuits, and to keep the independence of the divided circuits by supplying clocks to these latch circuits. Namely, according to this approach, latch circuits and clocks are necessary. As the number of divided circuits increase, it is also required to increase the clock frequency. Further, there is also an increase in the delay time due to the provision of the latch circuits. When a memory LSI having an access time of several nanoseconds is to be arranged into a pipeline system to enhance the high speed operation, the merit of the pipeline system is cancelled by the demerit of the provision of latch circuits. Further, in a circuit arranged in the pipeline system, the read information will be outputted at a short time interval. Then, the output buffer circuit is indispensable for supplying the information at the speed determined according to the external request. The memory of Brooktree has made only the information read system into a pipelined system. The memory of Fujitsu has not fully extracted the high speed operability of the pipeline system since the clock cycle time is longer than the access time.

SUMMARY OF THE INVENTION

Conventional memory LSIs have respective drawbacks. For example, the bipolar memory is of high speed but has a large power disipation and a low integration density. The CMOS memory has a high integration density, but has a considerably low operation speed compared to the bipolar memory. With regard to the pipeline system, it is very difficult to fully extract its high speed operability due to the delays by the provision of latch circuits, and to the adaptability of the information supply to the external circuit.

An object of this invention is to provide a semiconductor integrated circuit capable of high speed operation, low power dissipation and high integration density.

For achieving this object, the clock cycle of the clock signal for controlling the data read operation from the memory cell is set at about ½ of the maximum access time $t_{aa\ max}$. In response to the application of the 0th clock pulse ($T_0$) of this clock pulse, X and Y address signals are decoded and the first access operation in the memory cells is commenced. Similarly, in response to the application of the first clock pulse ($T_1$) of the clock signal, another X and another Y address signals are decoded to commence the second access operation of the memory cells. The access operations of the memory cells in response to the second clock pulse ($T_2$) and on of the clock signal are also similar to the above. Therefore, read-out signals are successively derived from the output of the sense amplifier according to the first, the second, and so on access operations.

To the output of the sense amplifier, the inputs of a first and a second memory circuit are connected. The first memory circuit stores the output data of the sense amplifier according to odd-numbered (1, 3, 5, ...) access operations, and the second memory circuit stores the output data of the sense amplifier according to even-numbered (2, 4, 6, ...) access operations.

In response to the second-and-on even-numbered clock pulses (i.e. $T_2$, $T_4$, ...), the stored data in the first memory circuit is transferred to the data output circuit, and in response to the second-and-on odd-numbered clock pulses (i.e. $T_3$, ...), the data stored in the second memory circuit is transferred to the data output circuit.

Therefore, from the third clock pulse ($T_3$) and on, data responding to the access operations beginning with the second access operation are successively obtained at the output of the data output circuit at a clock cycle of about ½ of the maximum access time $t_{aa\,max}$.

Even in the case where the output data according to the access operation are obtained at a high speed at the output of the sense amplifier, due to the dispersion of the performances of the semiconductor integrated circuit, the desired data can be successively obtained at the output of the data output circuit. This is because the output data of the sense amplifier according to the first access operation is stored in the first memory circuit even at the time of application of the second clock pulse ($T_2$) defining the commencement of the data output from the data output circuit. Namely, if the second memory circuit is omitted and only the first memory circuit is connected to the output of the sense amplifier, at the time of application of the second clock pulse ($T_2$) which determines the commencement of the data output from the data output circuit, the data of the first memory circuit is renewed by the output data of the sense amplifier according to the second access operation, and hence the output data of the sense amplifier according to the first access operation vanishes. Then, it becomes impossible to perform successive output of the desired data from the data output circuit.

Other objects, features and advantages of this invention will be made clear in the following detailed description of the preferred embodiments taken in conjunction with the accompanying drawings.

BRIEF DESCRIPTION OF THE DRAWINGS

FIGS. 2A–2K and 3A–3I are timing charts for explaining the operation of the circuit of the embodiment of FIG. 1.

DETAILED DESCRIPTION OF THE PRESENT INVENTION

Figure 1:
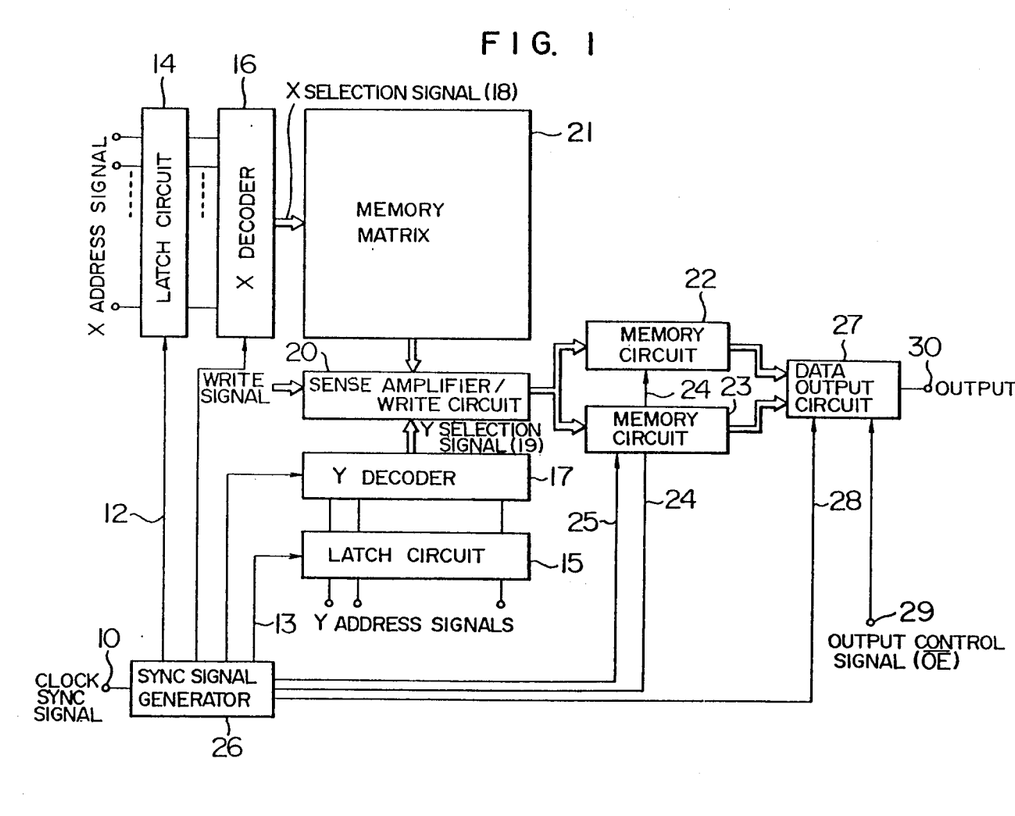
FIG. 1 illustrates an embodiment of a memory circuit of a semiconductor integrated circuit according to an embodiment of the present invention.

FIG. 1 is a conceptual block diagram of the structure of a first embodiment of the memory circuit of the semiconductor integrated circuit of the present invention.

The operation of the circuit will be described along the flow of a signal. Signals which are inputs to the memory circuit of FIG. 1 are those signals which include X address signal, Y address signal, chip selection signal, and write data, similar to the ordinary memory circuit, and newly provided clock sync. signal 10. Here, although the clock sync. signal 10 as an input to the memory circuit from outside of the semiconductor integrated circuit enhances the effect of this invention, it is not indispensable. Namely, this clock sync. signal 10 can be generated from the delay signal responding to the transition of the X address or the Y address signal.

X address and Y address signals, etc. are latched in latch circuits 14 and 15 by signals 12 and 13 generated on the basis of the clock sync. signal 10, and further led to an X decoder 16 and a Y decoder 17. The X address signal is transformed into a word driver signal by the X decoder 16 to generate an X selection signal 18 of the memory matrix, the Y address signal is transformed into a Y selection signal 19 by the Y decoder 17 to do selection of a sense amplifier 20. Thus, information in one memory cell in a memory matrix 21 is read out.

Generally in the memory circuit, there is a delay time unique to each memory circuit from the time of inputting the X and Y address input signals by the latch circuits 14 and 15 to the time when the information is read out at the output of the sense amplifier 20. This delay time includes those delay time components which vary according to the circuit type and the mutual interference, and those delay time components which are accompanied with the variations of the element characteristics such as the magnitude of the basic design rule, the temperature dependence, etc. The latter delay time components have small dispersion in the same LSI. The dispersion of the former delay time components can also be reduced in the same LSI when manufactured with sufficient care. Considering these features, the timing for inputting the sense amplifier output, which is the read-out information, into a first and a second memory circuit 22 and 23, which are the main feature of this invention, will be considered. The information read out of the memory matrix 21 to the sense amplifier is outputted in a time period at most shorter than the maximum access time $t_{aa\,max}$. Thus, control signals 24 and 25 are supplied from a sync. signal generator 26 so that the information is first inputted into the first memory circuit 22 just after being outputted from the sense amplifier 20, and another information corresponding to the next address signal is inputted into the second memory circuit 23 just after being outputted from the sense amplifier 20. By such arrangement, the first and the second memory circuits 22 and 23 fetch the output of the sense amplifier 20 alternately in response to the change in the address signal.

A data output circuit 27 selects one of the outputs of the first and the second memory circuits 22 and 23 based on a control signal 28 supplied from the sync. signal generator 26 and controls the output 30 by an output control signal 29 ($\overline{OE}$). The outline of the operation of this invention has been described above. Further detailed description will be made referring to the timing charts of FIGS. 2 and 3.

Even among the semiconductor integrated circuits including memory cells which are designed under the same conditions, there occur dispersions in the access time due to the dispersions of the manufacturing conditions. The central value in the tolerable dispersion range of the access time is called the standard access time $t_{aa}$

*typ*. The maximum value in the tolerable dispersion range is called the maximum access time $t_{aa\ max}$. The minimum value in the tolerable dispersion range is called the minimum access time $t_{aa\ min}$.

Figure 2:
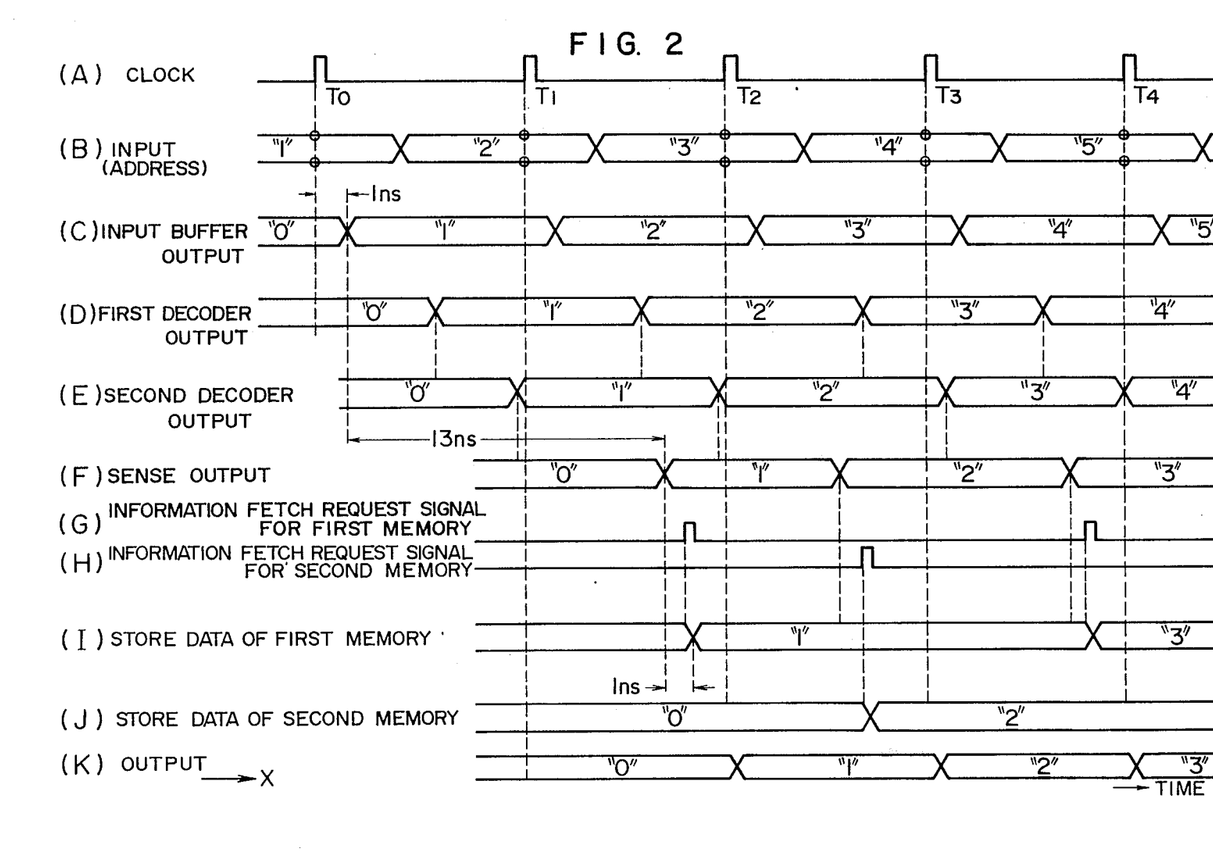

FIG. 2 is a time chart when the access time of the actually manufactured semiconductor integrated circuit is long and near the maximum access time $t_{aa\ max}$. From this figure, it can be seen that the clock cycle of the clock sync. signal 10 is set at about ½ of the maximum access time $t_{aa\ max}$.

Figure 3:
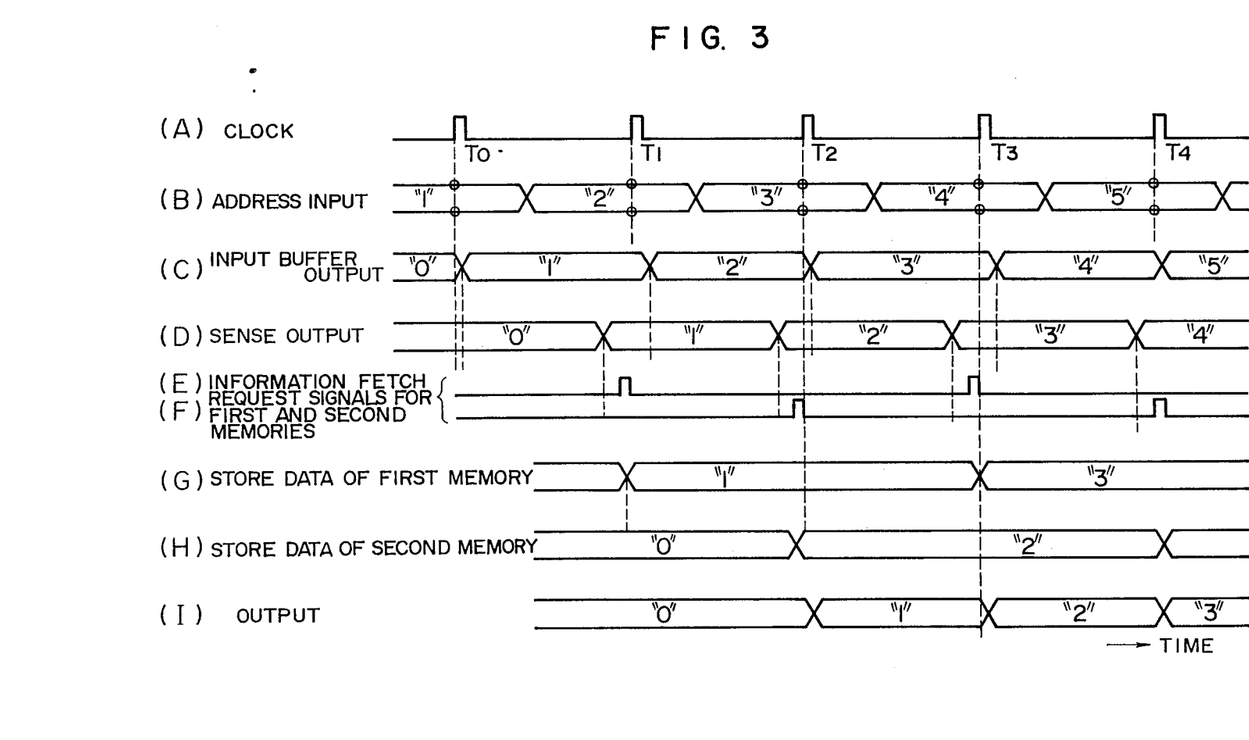

FIG. 3 is a time chart when the access time of the actually manufactured semiconductor integrated circuit is short and near the minimum access time $t_{aa\ min}$.

The time charts of FIGS. 2 and 3 will be described in detail hereinafter.

Signals (A) to (K) of FIG. 2 show timings of the signals at various portions of the circuit of FIG. 1. The time axis is taken in the X direction and there are shown the timings from the input address signal to the data output signal. As shown by the clock sync. signal 10 in waveform (A) of FIG. 2, the 0th clock pulse ($T_0$) of the clock sync. signal 10 is preferably sent at the earliest time after all the input signals (address signals) are fixed, for the purpose of high speed operation. By this 0th clock pulse signal ($T_0$), the first address signal "1" is led to an input buffer circuit (not shown), to initiate the memory read operation at the first address "1". As shown in waveform (C) of FIG. 2, the signal "1", outputted after the delay of about 1 nano-second from the input buffer, passes through the first and the second decoders constituting the X and Y decoders, and a sense amplifier. Due to the delays of these elements, the information of the memory cell "1" is outputted from the sense amplifier about 13 nano-seconds later (cf. signal waveforms (D), (E) and (F) of FIG. 2). This delay time is dispersed by dispersions in the electric characteristics of the latch circuits 14 and 15, the decoders 16 and 17, the memory cells 21, and the sense amplifier circuit 20. Therefore, the timing setting of the latch signals 24 (cf. FIG. 2 (G)) and 25 (cf. FIG. 2 (H)) for fetching the output of the sense amplifier 20 into the first and the second memory circuits 22 and 23 becomes important. Namely, if the fetch signal for the first memory circuit 22 is supplied before the first data output signal "1" of the sense amplifier 20 corresponding to the first address signal "1" is outputted from the sense amplifier 20, an erroneous signal (signal "0" in this case) is inputted into the first memory circuit 22. If this signal fetching is widely delayed after the output of the data output signal "1" from the sense amplifier 20, the fetch time of the read information into the first memory circuit 22 is delayed by that time length, elongating the effective access time. When this is set 1 nano-second after the output of the sense amplifier, signal "1" is inputted into the first memory circuit 22 about 14 nano-seconds after the output produced by the input buffer.

Namely, in response to the information fetch request signal 24 of FIG. 2 (G), the data output of the sense amplifier 20 is inputted to the first memory circuit 22. This information fetch request signal 24 of FIG. 2 (G) is generated from the sync. signal generator 26 about 1 nano-second after the generation of the output data of the sense amplifier 20 (i.e. signals "1", "3", . . . in the waveform (F) of FIG. 2) corresponding to the odd-numbered address signals (i.e. signals "1", "3", . . . in the waveform (B) of FIG. 2). The second memory circuit 23 fetches the data output of the sense amplifier 20 in response to the information fetch request signal 25 of FIG. 2 (H). The information fetch request signal 25 is generated from the sync. signal generator 26 about 1 nano-second after the generation of the output data of the sense amplifier 20 (i.e. signals "2", . . . of waveform (F) of FIG. 2), in response to the even-numbered address signals (i.e. signals "2", . . . of waveform (B) of FIG. 2). When the access time of the semiconductor integrated circuit becomes long due to the dispersion of the manufacturing conditions, the generation timing of the information fetch request signals 24 and 25 generated from the sync. signal generator 26 formed in the same semiconductor integrated circuit also becomes late. This correlation of the delay in the access time and the delay in the generation timing of the information fetch request signal is one of the important features of this invention.

Therefore, the data held in the first and the second memory circuits 22 and 23 are held for twice the time length of the clock cycle of the clock sync. signal 10 as shown in waveforms (I) and (K) of FIG. 2.

The data stored in the first memory circuit 22 are transferred to the data output circuit 27 in response to the second-and-on even-numbered clock pulses (i.e. signals $T_2$, $T_4$, . . . of waveform (A) of FIG. 2), and the data stored in the second memory circuit 23 are transferred to the data output circuit 27 in response to the second-and-on odd-numbered clock pulses (i.e. signals $T_3$, . . . of waveform (A) of FIG. 2).

Therefore, as shown in waveform (K) of FIG. 2, after the third clock pulse (i.e. signal $T_3$ of waveform (A) of FIG. 2), data responding to the second-and-on access operations (signals "2", "3", . . . of waveform (K) of FIG. 2) can be successively obtained from the output 30 of the data output circuit 27 at a clock cycle shorter than the maximum access time $t_{aa\ max}$. Namely, the effective access time in the successive read operation from the memory matrix 21 can be uniquely determined by the clock cycle of the clock sync. signal 10, realizing enhancement of high speed operation of the memory access.

FIG. 3 is a time chart in the case when the access time of an actually fabricated semiconductor integrated circuit is short and near the minimum access time $t_{aa\ min}$.

In FIG. 3, waveform (A) represents a clock sync. signal, waveforms (B) are X and Y address input signals, waveforms (C) are the output signals of the address input buffers, waveforms (D) are the output signals of a sense amplifier 20, waveform (E) is an information fetch request signal 24 for fetching the output of the sense amplifier 20 into the first memory circuit 22, waveform (F) is an information fetch request signal 25 for fetching the output of the sense amplifier 20 into the second memory circuit 23, waveforms (G) are store data of the first memory circuit 22, waveforms (H) are store data of the second memory circuit 23, and waveforms (I) are the output signals of the data output circuit 27. In FIG. 3, waveforms corresponding to the first decoder output and the second decoder output as shown at waveforms (D) and (E) of FIG. 2 are omitted.

Because the access time of this semiconductor integrated circuit is fast, after the application of the 0th clock pulse ($T_0$), data "1" according to the first access operation is generated from the output of the sense amplifier 20 prior to the application of the first clock pulse ($T_1$), as shown in waveform (D) of FIG. 3. In response to this high speed access operation, the timing of generation of the information fetch request signals 24 and 25 generated from the sync. signal generator 26 becomes also fast, as shown in waveforms (E) and (F) of FIG. 3. Therefore, the store data in the first and second memory circuits 22 and 23 to be controlled by these information fetch request signals 24 and 25 are held during a time period twice as long as the clock cycle of the clock sync. signal 10, as shown in waveforms (H) and (I) of FIG. 3.

In this case too, the store data in the first memory circuit 22 are transferred to the data output circuit 27 in response to the second-and-on even-numbered clock pulses (i.e. signals $T_2$, $T_4$, ... in waveform (A) of FIG. 3), and the store data in the second memory circuit 23 are transferred to the data output circuit 27 in response to the second-and-on odd-numbered clock pulses (i.e. signals $T_3$, ... in (A) of FIG. 3).

Therefore, the output data of the data output circuit 27 are as shown in waveform (I) of FIG. 3. It can be seen that even in case when the output data following the access operation are obtained at a minimum access time $t_{am\ min}$ from the output of the sense amplifier 20, due to the dispersion of the characteristics, the desired data can be successively obtained from the output of the data output circuit 27. This is because the output data of the sense amplifier 20 following the first access operation is stored in the first memory circuit 22 even at the time of application of the second clock pulse ($T_2$) which defines the initiation of the data output of the data output circuit 27. Namely, in case when the second memory circuit 23 was omitted and only the first memory circuit 22 was connected to the output of the sense amplifier 20, the data of the first memory circuit 22 would be renewed by the output data of the sense amplifier following the second access operation at the time of application of the second clock pulse defining the initiation of the data output from the data output circuit 27. Therefore, the output data of the sense amplifier 20 following the first access operation would be vanished and it would become impossible to successively output desired data from the data output circuit 27.

Figure 4:
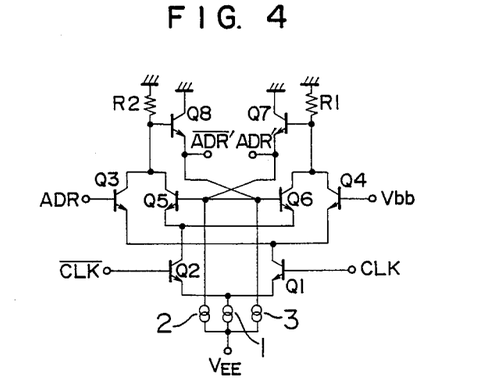
FIG. 4 illustrates an embodiment of a circuit appropriate for the latch circuits 14 and 15 in the embodiment of FIG. 1.

FIG. 4 is a circuit diagram of an embodiment of the present invention showing one of the appropriate circuits for the latch circuits 14 and 15 shown in FIG. 1. In the figure, ADR denotes an address signal terminal, $V_{bb}$ denotes a reference voltage, CLK and $\overline{CLK}$ denote clock signal terminals, and ADR′ and $\overline{ADR0}$ / denote latched output signals. Here, a differential type circuit is employed for inputting the clock signals with high precision. Here, however, a reference voltage may be applied to one input terminal. Also, it would be without saying that a complementary signal of the address signal may be connected to the address signal reference voltage terminal to operate the circuit in a differential type. Also, other kinds of latch circuits may be used.

The latch circuit of FIG. 4 comprises first differential pair transistors Q1 and Q2 having their emitters connected to a first stabilized current source 1, second differential pair transistors Q3 and Q4 having their emitters connected to the collector of the transistor Q1, third differential pair transistors Q5 and Q6 having their emitters connected to the collector of the transistor Q2, collector load resistors R1 and R2, a first output transistor Q7 having its emitter connected to a second stabilized current source 2, and a second output transistor Q8 having its emitter connected to a third stabilized current source 3.

Figure 5:
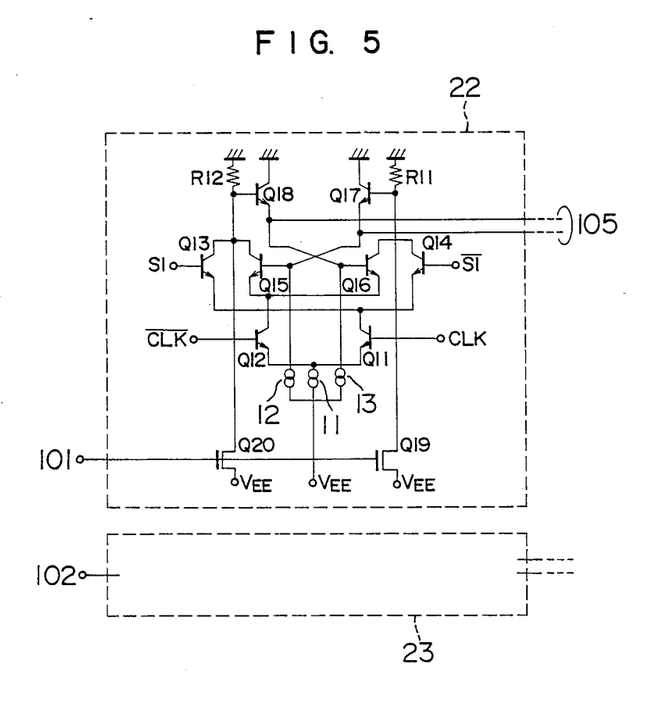
FIG. 5 illustrates an embodiment of a circuit appropriate for the memory circuits 22 and 23 in the circuit of FIG. 1.

FIG. 5 is a circuit diagram showing an embodiment of the invention which is appropriate for the memory circuits 22 and 23 shown in FIG. 1. In the figure, S1 and $\overline{S1}$ denote terminals connected to the output terminal of the sense amplifier 20, CLK and $\overline{CLK}$ denote input terminals for the sync. signals, 101 and 102 denote output control signal terminals, and 105 denotes output terminals. A circuit 23 encircled by a broken line is a similar circuit as a circuit 22 encircled by a broken line, with different control and clock signals. This memory circuit is similar to the circuit of FIG. 4 in the point that signals are inputted into the memory circuits 22 and 23 by clocks, but is featured by the ability that the level of the output voltage can be raised and lowered by the control terminals 101 and 102.

Although an example is shown here, it is not limitative. Any circuit which has a function of selectively extracting a signal from a memory circuit by a control signal, can be employed. Also, the outputs of the memory circuits 22 and 23 may be outputted in parallel according to the requirement of the external circuits.

Figure 6:
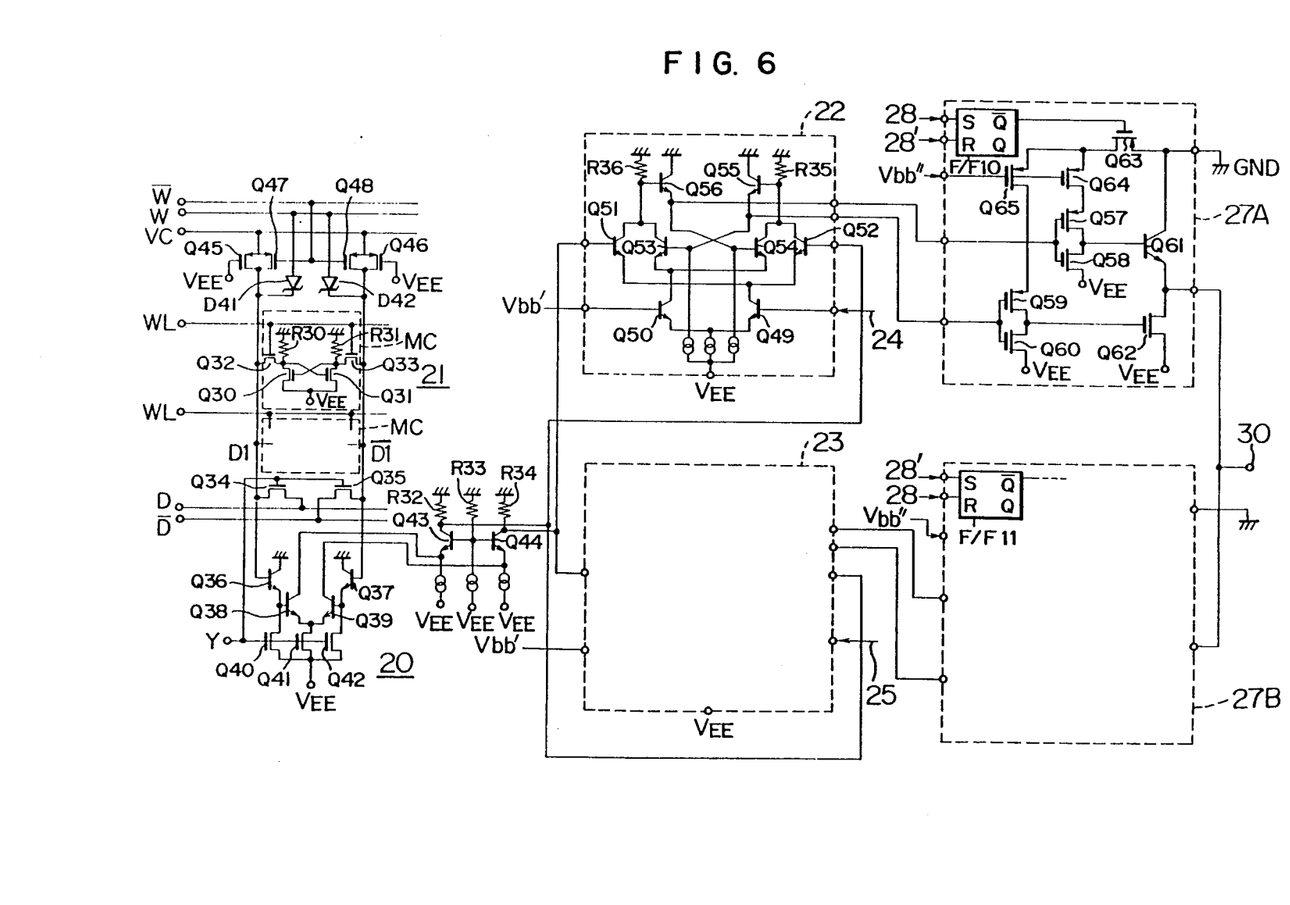
FIG. 6 illustrates an embodiment of a circuit appropriate for the memory cell MC of the memory matrix 21, the sense amplifier and the write circuit 20, the first and the second memory circuits 22 and 23, and the data output circuits 27A and 27B of the embodiment of FIG. 1.

FIG. 6 is a circuit diagram of an embodiment of the present invention optimum for the memory cells MC of the memory matrix 21, the sense amplifier and write circuit 20, the first and second memory circuits 22 and 23, the data output circuits 27A and 27B of FIG. 1.

The memory cell MC of the static random access memory (SRAM) comprises N channel MOSFETs Q30 and Q31 cross-coupled to store a memory cell information, transfer gate N channel MOSFETs Q32 and Q33 driven by a word line WL to perform data transfer between data lines D1 and $\overline{D1}$ and the N channel MOSFETs Q30 and Q31 in the memory cell MC, and high resistance loads R30 and R31.

The source-drain paths of write-in N channel MOSFETs Q34 and Q35 are connected between the data lines D1 and $\overline{D1}$ and write-in data lines D and $\overline{D}$. The gate of these MOSFETs Q34 and Q35 are driven by a Y selection signal Y.

Signals on the data lines D1 and $\overline{D1}$ are coupled to the bases of emitter-coupled differential pair transistors Q38 and Q39 through respective emitter follower transistors Q36 and Q37. N channel MOSFETs Q40, Q41, and Q42 act as current sources for activating the transistors Q36 to Q39 in response to a Y selection signal Y.

The collector signals of the emitter-coupled differential pair transistors Q38 and Q39 are transmitted to the inputs of the first and the second memory circuits 22 and 23 through the emitter-collector paths of respective common-base transistors Q43 and Q44.

To the data lines D1 and $\overline{D1}$ of the memory cell MC, a data line load circuit comprising P channel MOSFETs Q45 to Q48 and Schottky diodes D41 and D42 is connected. Here, W and $\overline{W}$ are a write control signal and its complementary signal. A feature lies in the structure that the write control signal W is supplied to the data lines D1 and $\overline{D1}$ through the Schottky diodes D41 and D42, and by rapidly pulling up the potential of the W line no sooner than the termination of the write operation, the potential of the data line, which has been lowered in the write operation, is pulled up, to reduce the recovery time. Further, a potential which is formed by subtracting the forward voltage drop of the Schottky diode from the W line voltage is preliminarily applied to a VC terminal to enhance the high speed operation.

The first memory circuit 22 of FIG. 6 comprises transistors Q49 to Q56, and resistors R35 and R36. The circuit construction is similar to that of FIG. 5. The second memory circuit 23 has the same circuit construction as the first memory circuit 22. The information fetch request signal 24 of waveform (G) of FIG. 2 is applied to the base of the transistor Q49 of the first memory circuit 22, and another information fetch request signal 25 of waveform (H) of FIG. 2 is applied to the base of the corresponding transistor of the second memory circuit 23. To the base of the transistor Q50 in the first memory circuit 22, a dc reference voltage $V_{bb}'$ is applied. This dc reference voltage $V_{bb}'$ is also applied to the base of the corresponding transistor in the second memory circuit 23. In this way, complementary signals responding to the data of a memory cell are derived from the respective emitters of the transistors Q55 and Q56 of the first memory circuit 22.

The data output circuit 27 of FIG. 1 is formed of a parallel connection of the first and the second data output circuits 27A and 27B in FIG. 6. The first data output circuit 27A comprises a first CMOS inverter having its input responding to the emitter output of the transistor Q56 of the first memory circuit 22 and constituted of a P channel MOSFET Q57 and an N channel MOSFET Q58, a second CMOS inverter having its input responding to the emitter output of the transistor Q55 of the first memory circuit 22 and constituted of a P channel MOSFET Q59 and an N channel MOSFET Q60, an NPN bipolar transistor Q61 having its base responding to the output of the first CMOS inverter Q57 and Q58, an N channel MOSFET Q62 having its gate responding to the output of the second CMOS inverter Q59 and Q60, a set-reset (SR) type flip-flop F/F10 having its set input S responding to the first data output control signal 28 (i.e. the second-and-on even-numbered clock pulses shown at signals $T_2$, $T_4$, ... of waveform (A) of FIG. 2) and its reset input R responding to the second data output control signal 28' (i.e. the second-and-on odd-numbered clock pulses shown at signals $T_3$, of waveform (A) of FIG. 2), a P channel MOSFET Q63 having its gate responding to the $\overline{Q}$ output of the flip-flop F/F10, and P channel MOSFETs Q64 and Q65 serving as stabilized current sources by being applied with a predetermined dc voltage $V_{bb}''$ to their gates. The N channel MOSFET Q62 may be replaced with a bipolar transistor. During the time period when the $\overline{Q}$ output of the flip-flop F/F10 is at the low level, since the MOSFET Q63 is ON, one of the transistor Q61 and the MOSFET Q62 is ON in response to the complementary signals responding to the memory cell data and the other is OFF, to provide effective data at the output of the data output circuit 27A. During the time period when the $\overline{Q}$ output of the flip-flop F/F10 is at the high level, since the MOSFET Q63 is OFF, the transistor Q61 and the MOSFET Q62 are simultaneously OFF, and the outputs of the data output circuit 27 themselves are at the high impedance state. In FIG. 6, a negative supply voltage of about −5 volts is supplied to a $V_{EE}$ terminal By setting the stabilized currents flowing through the P channel MOSFETs Q64 and Q65 to predetermined levels, transmission of large noises to the ground potential GND and the negative voltage source $V_{EE}$ generated by the driving current of load capacitance connected to the output terminal 30 can be prevented.

In FIG. 6, the output signals of the circuit 22 are connected directly to the input terminals of 27A. In this circuit, the low level of the output signals of the circuit 22 are higher than the potential $V_{EE}$. Thus, the N channel MOSFETs Q60 are slightly of ON-states to avoid this ON-states, it is effective insert the level-up circuit between circuits 22 and 27A.

In the second memory circuit 27B, the set input S and the reset input R of the SR type flip-flop F/F11 respond respectively to the second data output control signal 28' and the first data output control signal 28. In other respects, the second memory circuit 27B is similarly constructed as the first memory circuit 27A.

In FIG. 6, it is possible to substitute the ground potential GND with a positive supply voltage $V_{CC}$ and the negative supply voltage $V_{EE}$ with a ground potential GND.

Figure 7:
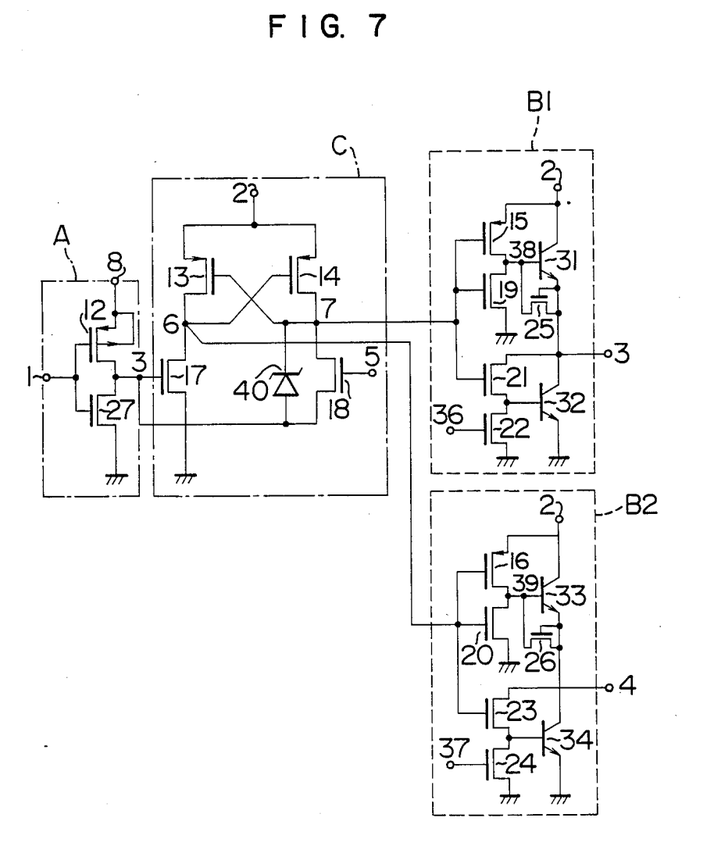
FIG. 7 illustrates an embodiment of the input buffer circuit adapted to receive the X address signal, the Y address signal, the chip selection signal, or the signals such as write data in the embodiment of FIG. 1.

FIG. 7 is a circuit diagram of an embodiment of the input buffer circuit of low power dissipation, adapted to receive such signals as the X address signal, the Y address signal, the chip selection signal, the write-in data, etc.

This input buffer circuit is constituted of a first stage of a waveform shaping inverter circuit A, an intermediate stage of a low power dissipation type flip-flop circuit C and a latter stage of BiCMOS output circuits B1 and B2 of low power dissipation and high load drive ability.

The supply voltage is set at 5 volts and is supplied to the power source terminal 2. To a terminal 8 of the inverter circuit A, such a constant voltage is applied which makes a P channel MOSFET 12 turned off to allow almost no current to flow therethrough when the signal supplied to an input terminal 1 is at the high level. When the potential of the input terminal 1 changes from the low level to the high level in this state, the potential of an output terminal 3 of the inverter changes from the high level (the potential of the terminal 8) to the low level (the ground potential). Hence, an N channel driver MOSFET 17 becomes turned-off and an N channel driver MOSFET 18 is turned on, changing the potential of a terminal 7 of the flip-flop circuit C to the low level. When the terminal 7 becomes of low level, a P channel load MOSFET 13 is turned on to pull up the potential of a terminal 6, then turning off a P channel MOSFET 14 and stopping the current flow in the flip-flop circuit, thereby terminating the operation (i.e. becoming into a steady state). When the potential of the input terminal 1 changes from the high level to the low level, the potential of the terminal 3 changes from the low level to the high level, turning on the N channel MOSFET 17 and pulling down the potential of the terminal 6. The N channel MOSFET 18 is turned off. As the result, the P channel MOSFET 14 is turned on to pull up the potential of the terminal 7 and to turn off the P channel MOSFET 13, thereby terminating the operation. Here, the potential supplied to the terminal 5 is preferably a potential made by adding the threshold voltage of the MOSFET 18 to the potential supplied to the terminal 8. By so selecting the potential, it is convenient since the MOSFET 18 becomes turned off when the potential of the input terminal 1 is of the low level, and the maximum current flows through this MOSFET 18 when the potential of the terminal 3 is lowered. Here, the Schottky diode 40 is provided to rapidly pull up the potential of the terminal 7 when the potential of the terminal 3 changes from the low level to the high level. This diode may be omitted according to the desired conditions.

The output of the flip-flop circuit C is continuously led to composite circuits B1 and B2 of complementary MOSFETs and bipolar transistors to afford drivability. The circuit B1 encircled by a broken line is formed of small MOSFETs and bipolar transistors, attempting to reduce the load capacitance of the output terminal 7 of the flip-flop circuit, so as to shorten the delay time of the flip-flop circuit. A MOSFET 25 is provided for preventing the deterioration of the characteristics of the bipolar transistor due to the application of a high reverse voltage between the emitter and the base of the bipolar transistor. The circuit B2 has the same construction as the circuit B1. It is without saying that the circuits B1 and B2 may be replaced with usual inverter circuits formed of MOSFETs.

Figure 8:
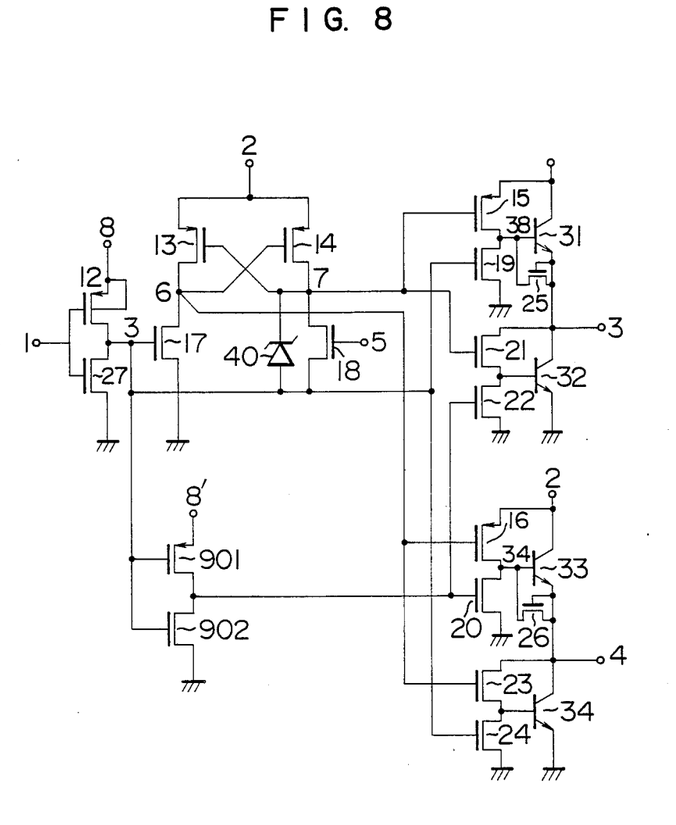
FIGS. 8, 9 and 10 illustrate respective circuits of modified embodiments of FIG. 7.

A constant potential may be supplied to terminals 36 and 37 to constantly draw base charges of bipolar transistors 32 and 34. For further enhancing the high speed operation, the terminals 36 and 37 may be connected to terminals 38 and 39, respectively, or separate inverter circuits may be provided to invert the signals on the terminals 6 and 7 and to supply them. Also, the terminals 36 and 37 may also be connected directly to the terminals 6 and 7. Also, as shown in FIG. 8, the signal at the terminal 3 or the inversion thereof may be used. Here, a terminal 8' may be applied with the same potential as that of the terminal 8, or with a potential higher than the potential of the terminal 8 by the threshold voltage of a P channel MOSFET 901.

Figure 9:
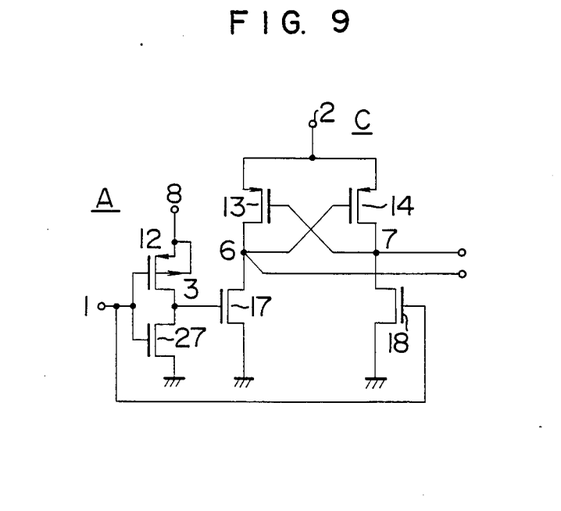
Figure 10:
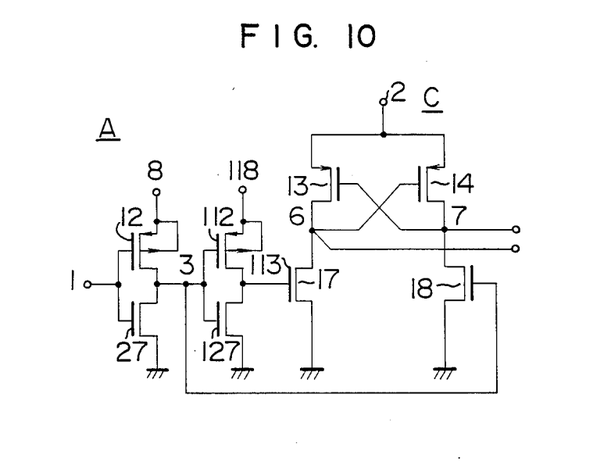

The inverter circuit A and the flip-flop circuit C of FIG. 7 can also be modified as shown in FIGS. 9 and 10.

The circuit of FIG. 9 is a circuit performing similar operation as that portion of FIG. 7 which is from the input terminal 1 through the inverter A constituted of the MOSFETs 12 and 27 to the outputs 6 and 7 of the flip-flop circuit (represented as C in FIG. 7). The signal on an input terminal 1 is supplied to the gate of a MOSFET 18 in the flip-flop circuit C, and an inverted signal formed by an inverter is supplied to the gate of a MOSFET 17. As it is clear that this circuit serves in a similar manner to the circuit of FIG. 7, further description is dispensed with. Here, however, it goes without saying that it is desirable to supply the voltage applied to the terminal 8 of FIG. 1 to a voltage supply terminal 8 for the inverter of FIG. 9. Also it is desirable from the viewpoints of high speed operation and reduction of power dissipation to design the gate width of the MOSFETs 12 and 27 constituting the inverter to be larger than the gate width of the MOSFETs 17 and 18, so as to reduce the delay time, to select the gate width of the N channel MOSFET 27 to be larger than the gate width of the P channel MOSFET 12, to rapidly shift the MOSFET 17 to the turned-off state when the input changes from the low level to the high level. By employing such expedients, the inconvenience that both the MOSFETs 17 and 18 are turned on when the potential of the input terminal 1 changes from the low level to the high level, thereby delaying the change-over of the output terminals, is reduced.

FIG. 10 shows a circuit in which an inverter constituted of MOSFETs 112 and 127 is added to the circuit of FIG. 9 and a potential higher than the potential at the terminal 8 by the threshold voltage of the P channel MOSFET is supplied to a supply voltage terminal 118 for the added inverter. Although detailed description of the circuit operation of FIG. 10 is dispensed with, there can be provided such features that since the input capacitance of the input terminal 1 of this circuit can be made small, higher speed operation than that of FIG. 9 circuit can be accomplished when the signal source impedance is large, and that since the input signal is waveformshaped in the first stage inverter to make the potential change abrupt, the transient current at the switchover of the flip-flop circuit is reduced to reduce the power dissipation.

Figure 11:
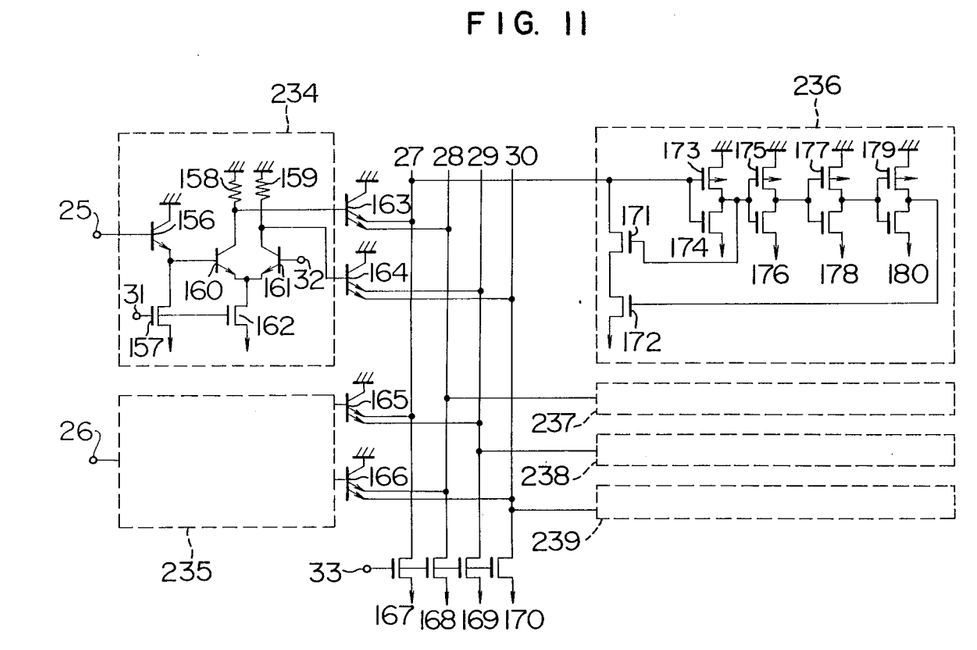
FIG. 11 illustrates an embodiment of the input buffer circuit and the decoder circuit adapted for receiving the X address signal and the Y address signal in the embodiment of FIG. 1.

FIG. 11 shows a circuit diagram of an embodiment of an input buffer circuit and a decoder circuit adapted for receiving the X address signal and the Y address signal of FIG. 1.

The input signal at an input terminal 25 of an input buffer circuit 234 is transmitted to emitter-coupled transistors 160 and 161 through an emitter follower transistor 156. Load resistors 158 and 159 are connected to the collectors of these emitter-coupled transistors 160 and 161. MOSFETs 157 and 162 which are controlled by the voltage on a bias voltage application terminal 31 work as current sources. The signals at the collectors of the emitter-coupled transistors 160 and 161 are transmitted to the bases of multi-emitter transistors 163 and 164, respectively.

Another input buffer circuit 235 is also constructed similar to the input buffer circuit 234. The signals at the collectors of emitter-coupled transistors responding to the input signal at an input terminal 26 are transmitted to the bases of multi-emitter transistors 165 and 166, respectively. Electrical connections between signal lines 27, 28, 29 and 30 and the emitters of the multi-emitter transistors 163, 164, 165 and 166, which essentially work as emitter followers, constitute an address decoder circuit of the so-called wired OR circuit type. MOSFETs 167, 168, 169 and 170 controlled by a voltage at a bias voltage application terminal 33 and connected to the signal lines 27, 28, 29 and 30 work as current sources.

Discharge control circuits 236, 237, 238 and 239 connected to the signal lines 27, 28, 29 and 30 allow large currents to flow when the voltage of the signal lines 27, 28, 29 and 30 changes from the high level to the low level.

Namely, when the input terminal 26 of the input buffer circuit 235 is at the high level, the respective emitters of the multi-emitter transistor 165 respond to this and take the low level and the respective emitters of the multi-emitter transistor 166 respond to the input and take the high level. When the input terminal 25 of the input buffer circuit 234 changes from the low level to the high level, in this state, the respective emitters of the multi-emitter transistor 163 change from the high level to the low level and the respective emitters of the multi-emitter transistor 164 change from the low level to the high level, in response thereto.

Therefore, due to the wired OR connections, the signal line 27 changes from the high level to the low level, the signal line 29 changes from the low level to the high level, and the signal lines 28 and 30 remain at the high level and do not change.

When the signal line 27 changes from the high level to the low level, N channel MOSFETs 171 and 172 of the discharge control circuit 236 are simultaneously controlled into the conductive state and rapidly discharge the large parasitic capacitance of the signal line 27.

Namely, in the first stage CMOS inverter of the discharge control circuit 236, the gate width of the P channel MOSFET 173 is designed far larger than that of the N channel MOSFET 174, and the logic threshold voltage of this first stage CMOS inverter is selected near the high level. Therefore, this first stage CMOS inverter 173 and 174 swiftly responds to the change of the signal line 27 from the high level to the low level and rapidly sets its output at the high level, controlling the MOS- FET 171 into the conductive state. Meanwhile, the tri-stages CMOS inverter 175, 176, 177, 178, 179, 180 has a large delay time. It requires a long delay time for the output of the final stage inverter 179 and 180 to change from the high level to the low level. Therefore, during this delayed time period, the N channel MOSFETs 171 and 172 of the discharge control circuit 236 are controlled to be simultaneously turned on and swiftly discharge the large parasitic capacitance of the signal line 27. After the lapse of this delay time, the output of the third stage CMOS inverter 179 and 180 finishes the change from the high level to the low level. Then, the N channel MOSFET 172 is controlled into the nonconductive state to reduce the wasteful power dissipation.

When the signal line 27 reversely changes from the low level to the high level, first the output of the first stage CMOS inverter 173 and 174 of the discharge control circuit 236 changes from the high level to the low level, and then the output of the final stage CMOS inverter 179 and 180 changes from the low level to the high level. Thus, the simultaneous conduction of the N channel MOSFETs 171 and 172 and the wasteful power dissipation in this occasion are avoided, and the change speed of the signal line 27 from the low level to the high level can be speeded up.

Other discharge control circuits 237, 238, and 239 act in completely the similar manner as that of this discharge control circuit 236.

Figure 12:
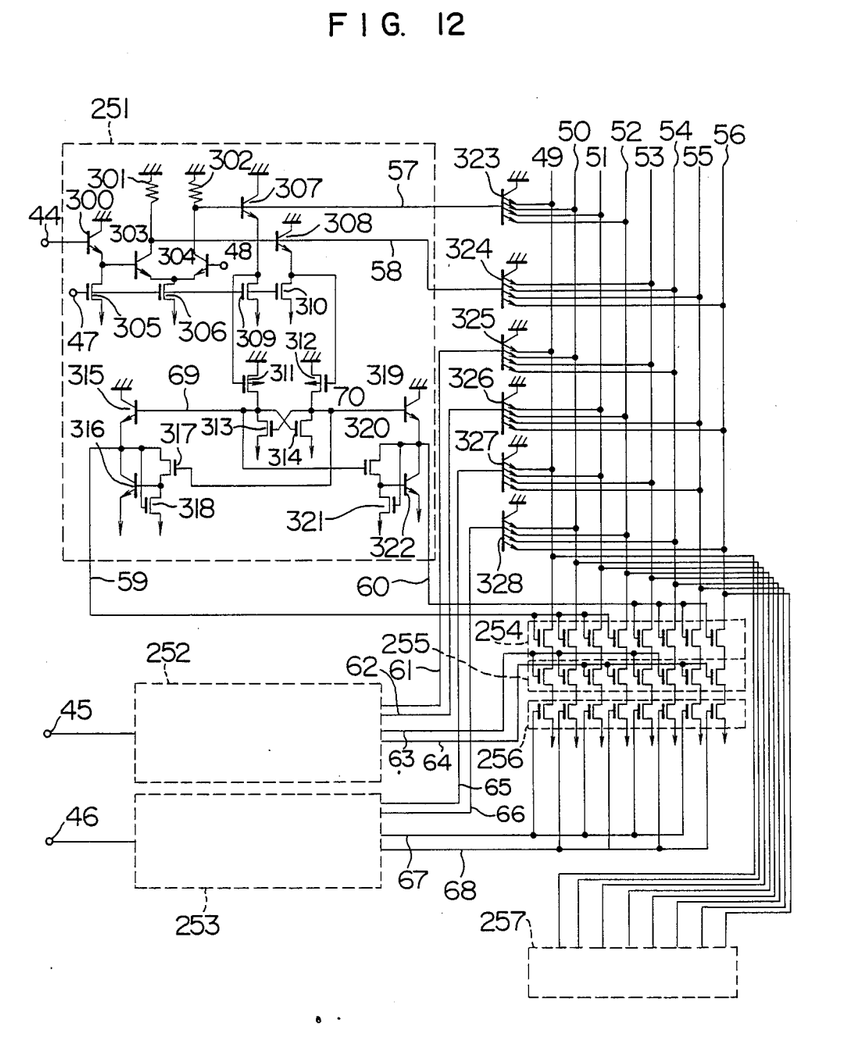
FIG. 12 illustrates another embodiment of the input buffer circuit and the decoder circuit adapted for receiving the X address signal and the Y address signal in the embodiment of FIG. 1.

FIG. 12 shows a circuit diagram of another embodiment of the input buffer circuit and the decoder circuit adapted for receiving the X address signal and the Y address signal of FIG. 1.

Namely, FIG. 12 is an embodiment in which larger bias currents are allowed to flow through the bias current sources of wired OR outputs outputting the low level than through other bias current sources. In FIG. 12: reference numerals 44, 45 and 46 denote address signal input terminals; 49 to 56 wired OR signal output terminals; 47 a bias voltage application terminal; 48 a reference voltage application terminal; 300 to 306 elements forming an address buffer circuit similar to the circuit 234 shown in FIG. 11; 252 and 253 circuits each being similar to the circuit 251; 323 to 328 multi-emitter NPN transistors; 257 a bias current source circuit similar to the MOSFETs 167 to 170 of FIG. 10; 57 and 58 output signals of the address buffer circuit consituted of the elements 300 to 306; 59 and 60 output signals of a level converter circuit constituted of elements 307 to 322; 254 a circuit constituted of NMOSFETs for decoding the level converted signals 59 and 60; 255 and 256 circuits each being similar to the circuit 254; 61, 62, 65 and 66 output signals of address buffers similar to 57 and 58; 69 and 70 internal signal terminals; and 63, 64, 67 and 68 output signals of level converter circuits similar to 59 and 60.

The circuit of this embodiment is featured in that the output signals 57, 58, 61, 62, 65 and 66 of the address buffers are decoded through the wired OR circuit of the multi-emitter transistors 323 to 328, that the signals 59, 60, 63, 64, 67 and 68 formed by level-converting the output signals of the address buffers through the level converter circuit formed of the elements 307 to 322 and working as an inverter are decoded in the circuits 254 to 256 each formed of N channel MOSFETs, and that larger bias currents are allowed to flow through wired OR circuits which have their output signals at the low level than those through the remaining seven wired OR circuits. The operation of the circuit of this embodiment will be described hereinbelow. For example, low level signals are inputted to the terminals 44, 45 and 46. Then, the wired OR output signal 49 takes the low level and the wired OR output signals 50 to 56 take the high level. Here, the output signals 57 and 58 of the address buffer circuit take the low level and the high level, respectively, and are inputted to the gate electrodes of the P channel MOSFETs 311 and 312 through the emitter follower circuit formed of the elements 307 to 310. A low level signal and a high level signal are applied to the gate electrodes of the P channel MOSFETs 311 and 312, respectively to drive the P channel MOSFET 311 conductive and the P channel MOSFET 312 non-conductive. The elements 311 to 314 constitute a flip-flop circuit. The N channel MOSFET 313 becomes non-conductive and another N channel MOSFET 314 becomes conductive. There is needed no power dissipation in the steady state of the flip-flop circuit constituted of the elements 311 to 314. The potential swing of the signals 69 and 70 is widened to have the high level at the ground potential and the low level at the negative source voltage, and are level-converted. Circuits constituted of elements 315 to 318 and of elements 319 to 322 are buffer circuits serving as a non-inverter. The signals 69 and 70 take the high level and the low level and the signals 59 and 60 take the high level and the low level, respectively, when the elements 311 and 314 are conductive and the elements 312 and 313 are non-conductive. Similarly, the signals 63 and 67 take the high level and the signals 64 and 68 take the low level. Among the connections, each formed of serially connected three N channel MOSFETs, between the wired OR outputs and the negative source voltage, only one of those three N channel MOSFETs connected to the terminal 49 are all conductive. The load of the wired OR output 49 is discharged by these three N channel MOSFETs and the bias current source 257 which flows substantially the constant bias current. To the remaining wired OR outputs 50 to 56, currents are allowed to flow through the circuit 257. Minimum currents may be allowed to flow which are required for level-shifting the high level from the ground potential. In case when the high level of the wired OR outputs may rise up to the ground potential, the bias current source 257 for supplying a constant bias current is not necessary. Although the circuit for flowing a large discharge current only to the wired OR which has its wired OR output changed to the low level is shown in FIG. 12, the circuit 256 or the circuits 255 and 256 may be removed from FIG. 12 and the source electrodes of the N channel MOSFETs in the circuit 255 or in the circuit 254 may be directly connected to the negative power terminal. Then, currents may be supplied to two or four wired OR lines which have their wired OR output signals at the low level. Such a circuit configuration is effective for those cases where it is not so necessary to reduce the power dissipation as to flowing a current only to one of the eight wired OR outputs as in FIG. 12 and it is desired to reduce the number of constituent elements.

Although description has been made on the signal level change by the flip-flop circuit and the N channel MOSFET driving by the non-inverter buffer circuit in connection with FIG. 12, it can be seen that the direct N channel MOSFET drive by the output of the current switch or the drive of N channel MOSFET by the output of the current switch through an emitter follower circuit may be adopted. In particular, the lattermentioned circuit of driving the N channel MOSFET through an emitter follower circuit provides the fastest operation.

Embodiments on the emitter follower circuit have been described hereinabove. When NPN transistor (163-166, 323-328) is replaced with an N channel MOSFET and so on, a source follower circuit of similar effects can be provided. It is of course possible to form a similar emitter follower circuit or a similar source follower circuit for a PNP bipolar transistor or a P channel MOSFET.

The present invention is not limited to the above-described embodiments. Various alterations or modifications can be employed.

For example, the number of memory circuits 22 and 23 in FIG. 1 is not limited to two, but may be increased to three, four, . . . . In such cases, the clock cycle of the clock sync. signal may be shortened to 1/N and the output signal of the sense amplifier may be inputted to each memory circuit once the N clock pulses, enabling successive read-out of the desired data at a short time interval from the output 30 of the data output circuit 27.

Also, the present invention is not limited to SRAM, and can be widely applied to semiconductor integrated circuits including semiconductor memories such as DRAM, PROM, EPROM, EEPROM.

As has been described above, according to the present invention, at least two memory circuits are provided to the output of a sense amplifier and fetch the output of the sense amplifier at different timing. By transferring the data stored in these two or more memory circuits to a data output circuit, the desired sense data can be successively read out from the output of the data output circuit at a short time interval.

What is claimed is:

1. A semiconductor integrated circuit comprising:
   (1) a memory matrix including a plurality of memory cells;
   (2) address means for selecting at least one of said plurality of memory cells of said memory matrix in response to an address signal;
   (3) a sense amplifier for amplifying a signal from said at least one selected memory cell;
   (4) a first memory circuit having an input connected to the output of said sense amplifier;
   (5) a second memory circuit having an input connected to the output of said sense amplifier; and
   (6) a signal generator for generating a first control signal and a second control signal in response to changes in said address signal,
   wherein the timing of said first control signal is set to be different from the timing of said second control signal,
   wherein said first memory circuit fetches the output of said sense amplifier in response to said first control signal, and
   wherein said second memory circuit fetches the output of said sense amplifier in response to said second control signal.

2. A semiconductor integrated circuit according to claim 1, further comprising a data output circuit having a first and a second input connected to the output of said first memory circuit and the output of said second memory circuit, respectively, wherein said signal generator further generates a third control signal in response to changes in said address signal, and wherein said data output circuit transmits alternately the data of said first and second memory circuits to an output of the output circuit in response to said third control signal.

3. A semiconductor integrated circuit according to claim 1, wherein said plurality of memory cells of said memory matrix are random access type memory cells.

4. A semiconductor integrated circuit according to claim 2, wherein said plurality of memory cells of said memory matrix are static random access type memory cells.

5. A semiconductor integrated circuit according to claim 3, wherein said plurality of memory cells of said memory matrix are dynamic random access type memory cells.

6. A semiconductor integrated circuit according to claim 2, wherein said data output circuit includes a first and a second CMOS inverter for responding to the complementary output signals of at least one of said first and second memory circuits, a first transistor having a control input terminal responding to the output of said first CMOS inverter and forming an output current path connected between a first operative potential point and the data output terminal, a second transistor having a control input terminal responding to the output of said second CMOS inverter and forming an output current path connected between said data output terminal and a second operative potential point, and current-stabilizing MOSFETs connected between said first and second CMOS inverters and said first operative potential point and allowing predetermined stabilized currents.

7. A semiconductor integrated circuit according to claim 1, further comprising:
   (7) an input buffer circuit for receiving said address signal,
   wherein said input buffer circuit includes a flip-flop circuit including a pair of first conductivity type MOSFETs responding to said address signal, and a pair of second conductivity type MOSFETs having drains connected to said pair of first conductivity type MOSFETs and gates, said gates and said drains of said pair of second conductivity type MOSFETs being crosscoupled.

8. A semiconductor integrated circuit according to claim 1,
   wherein said address means includes a decoder circuit including a multi-emitter transistor, a plurality of signal lines connected to the plurality of emitters of said multi-emitter transistor, and a plurality of current sources connected to said plurality of signal lines,
   wherein when the voltage of one of said plurality of signal lines changes from a high level to a low level, one of said plurality of current sources connected to said one signal line allows a larger current to flow than the currents of other current sources.

9. A semiconductor integrated circuit according to claim 1,
   wherein said address means has a decoder circuit including a multi-emitter transistor, a plurality of signal lines connected to the plurality of emitters of said multi-emitter transistor, and a plurality of current sources connected to said plurality of signal lines, and
   wherein when the voltage of one of said plurality of signal lines is of a low level, one of said plurality of current sources connected to said one signal line allows a larger current to flow than the currents of other current sources.

* * * * *

UNITED STATES PATENT AND TRADEMARK OFFICE
CERTIFICATE OF CORRECTION

PATENT NO. : 4,928,265

DATED : 22 May 1990

INVENTOR(S) : Hisayuki HIGUCHI et al.

It is certified that error appears in the above-identified patent and that said Letters Patent is hereby corrected as shown below:

| Column | Line | |
|---|---|---|
| 1 | 42 | After "respond" insert --to--. |
| 1 | 54 | Change "pie-" to -- pipe- --. |
| 1 | 55 | Change "pline" to --line--; after "proposed" insert --which--. |
| 7 | 37 | Change "vanished" to --lost--. |
| 7 | 45 | Change "$\overline{ADR0}$/" to --$\overline{ADR}$'--. |
| 9 | 66 | Change "ON-states to" to --ON-states. To--. |

Signed and Sealed this

Twenty-fourth Day of December, 1991

Attest:

HARRY F. MANBECK, JR.

*Attesting Officer*      *Commissioner of Patents and Trademarks*